United States Patent [19]

Anami et al.

[11] Patent Number: 4,977,538

[45] Date of Patent: Dec. 11, 1990

[54] SEMICONDUCTOR MEMORY DEVICE HAVING HIERARCHICAL ROW SELECTING LINES

[75] Inventors: Kenji Anami; Katsuki Ichinose, both of Hyogo, Japan

[73] Assignee: Mitsubishi Denki Kabushiki Kaisha, Tokyo, Japan

[21] Appl. No.: 400,223

[22] Filed: Aug. 29, 1989

[30] Foreign Application Priority Data

Aug. 29, 1988 [JP] Japan .................................. 63-214302

[51] Int. Cl.⁵ ...................... G11C 8/00; G11C 11/407; G11C 11/408
[52] U.S. Cl. ............................ 365/230.03; 365/230.06
[58] Field of Search ...................... 365/230.03, 230.06, 365/230.01, 189.08, 174, 51, 63; 307/463

[56] References Cited

U.S. PATENT DOCUMENTS 4,542,486 9/1985 Anami et al. ................... 365/230.03
4,807,191 2/1989 Flannagan .................. 365/230.03 X
4,875,190 10/1989 Sakano ........................ 365/230.03 X

OTHER PUBLICATIONS

List et al, "A 25ns Full-CMOS 1Mb SRAM", 1988 IEEE International Solid-State Circuits Conference, Digest of Technical Papers (1988) pp. 178-179 and 358.
Sasaki et al., "A 15ns 1Mb CMOS SRAM", 1988 IEEE International Solid-State Circuits Conference, Digest of Technical Papers (1988), pp. 174-175 and 355.
Wada et al, "A 14ns 1Mb CMOS SRAM with Variable Bit-Organization", 1988 IEEE International Solid-S-tate Circuits Conference, Digest of Technical Papers (1988), pp. 252-253 and 393.
Hung Chang Lin et al, "An Optimized Output Stage for MOS Integrated Circuits", IEEE International Solid State Circuits Conf., Digest of Technical Papers (1975), pp. 106-109, 185-186.

Primary Examiner—Stuart N. Hecker
Assistant Examiner—Alyssa H. Bowler
Attorney, Agent, or Firm—Lowe, Price, LeBlanc, Becker & Shur

[57] ABSTRACT

A memory cell array of this semiconductor memory device is divided into a plurality of large memory cell groups, and each of the large memory cell groups is further divided into a plurality of small memory cell groups. A plurality of main row-selecting lines, a plurality of sub row-selecting lines and a plurality of word lines are provided in the memory cell array, each of the large memory cell groups and each of the small memory cell groups, respectively. Main global decoders select one of the main row-selecting lines in response to an internal address signal. Sub global decoders select a sub row-selecting line associated with the selected main row-selecting line in the large memory cell group selected by a large memory cell group selecting signal. Local decoders select a word line associated with the selected sub row-selecting line in the small memory cell group selected by a small memory cell group selecting signal.

60 Claims, 10 Drawing Sheets

SEMICONDUCTOR MEMORY DEVICE HAVING HIERARCHICAL ROW SELECTING LINES

BACKGROUND OF THE INVENTION

1. Field of the Invention

The present invention relates generally to semiconductor memory devices, and more particularly to a semiconductor memory device having an improved access time, decreased power consumption and enhanced reliability by providing hierarchical row-selecting lines and word lines therein.

2. Description of the Background Art

FIG. 1 is a block diagram illustrating a first example of a conventional semiconductor memory device. Referring to the figure, row address data is externally applied to a row address input terminal group 1 to be amplified or inverted by a row address buffer 2, and then applied to a row address decoder 3. The row address decoder 3 decodes a row address data applied via the input terminal group 1.

Column address data is externally applied to a column address input terminal group 4 to be amplified or inverted by a column address buffer 5, and then applied to a column address decoder 6. The column address decoder decodes a column address data applied via the input terminal group 4. A memory cell array 7 is formed of a plurality of memory cells arranged in matrix for storing information. A read voltage with a small amplitude read from the memory cell array 7 via a multiplexer 8 is sensed and amplified by a sense amplifier 9. An output of the sense amplifier 9 is further amplified by an output data buffer 10 to a required level that the output is extracted to the outside of the semiconductor memory device, and then is externally outputted via a read data output terminal 11.

Write data is applied to a write data input terminal 12 to be amplified by an input data buffer 13. Further, a terminal 14 is supplied with a chip select input, while a terminal 15 is supplied with a read/write control input. A read/write control circuit 16 controls the sense amplifier 9, the output data buffer 10 and the input data buffer 13 in accordance with selection/non-selection of a chip and data read/write mode, determined by these inputs.

FIG. 2 is a diagram illustrating a configuration of the periphery of the memory cell array 7 in the semiconductor memory device shown in FIG. 1. The figure shows, for simplification, a double-row and double-column configuration of the memory cell array 7.

As shown in FIG. 2, memory cells 24a–24d are provided at the intersections of respective bit line pairs 20a, 20b and 21a, 21b and respective word lines 22 and 23 connected to output points of the row address decoder 3. In addition, a plurality of bit line loads 25a, 25b, 26a and 26b are provided having their respective one ends connected to a power source 18 and the other ends connected to their corresponding bit lines. Further, transfer gates 27a, 27b, 28a and 28b constituting the multiplexer 8 in FIG. 1 are provided, each having its gate supplied with an output signal of the column address decoder 6 in FIG. 1, its drain or source connected to its corresponding bit line, and its source or drain connected to a corresponding one of input/output lines (hereinafter referred to as I/O lines) 29a, 29b in a pair. A potential difference between the I/O lines 29a and 29b is detected by the sense amplifier 9, and an output thereof is amplified by the output buffer 10.

For each of the memory cells 24 in FIG. 2, for example, a high resistance load-type NMOS memory cell shown in FIG. 3A or a CMOS-type memory cell as shown in FIG. 3B is employed.

The memory cell 24 shown in FIG. 3A comprises driver transistors 41a and 41b. The transistor 41a has its drain connected to a storage node 45a, its gate connected to a storage node 45b and its source grounded. The transistor 41b has its drain connected to the storage node 45b, its gate connected to the storage node 45a and its source grounded. Furthermore, the memory cell 24 comprises access transistors 42a and 42b. The transistor 42a has its drain or source connected to the storage node 45a, its gate connected to the word line 22 or 23 and its source or drain connected to the bit line 20a or 21a. The transistor 42b has its drain or source connected to the storage node 45b, its gate connected to the word line 22 or 23 and its source or drain connected to the bit line 20b or 21b. Moreover, the memory cell 24 comprises load resistors 43a and 43b having their respective ends connected to the power source 18 and the other ends connected to the respective storage nodes 45a and 45b.

Meanwhile, the memory cell 24 shown in FIG. 3B comprises p channel transistors 44a and 44b in place of the load resistors 43a and 43b of the memory cell 24 in FIG. 3A. The transistor 44a has its drain connected to the storage node 45a, its gate connected to the storage node 45b and its source connected to the power source 18. The transistor 44b has its drain connected to the storage node 45b, its gate connected to the storage node 45a and its source connected to the power source 18.

An operation in the conventional example shown in FIG. 1 to FIG. 3 will now be described. Such case is considered that the memory cell 24a in the memory cell array 7 is selected. In this case, a row address data corresponding to a row, to which the memory cell 24a to be selected is coupled, is inputted from the row address input terminal group 1, so that the word line 22 connected to the memory cell 24a attains a selection level (e.g., logical high or the H level), while the other word line 23 attains a non-selection level (e.g., logical low or the L level). Meanwhile, a column address data for selecting a column corresponding to the bit line pair 20a, 20b connected to the memory cell 24a to be selected is inputted from the column address input terminal group 4, so that the transfer gates 27a and 27b connected to the bit line pair 20a, 20b are only rendered conductive. As a result, the selected bit lines 20a and 20b are only connected to the I/O line pair 29a, 29b, respectively, while the other bit lines 21a and 21b become a non-selection state to be separated from the I/O line pair 29a, 29b.

A read operation of the selected memory cell 24a will now be described. It is now assumed that the storage node 45a of the memory cell 24a is at the H level, and the storage node 45b is at the L level. At this time, the driver transistor 41a in the memory cell is not conductive, while the other driver transistor 41b is conductive. Further, since the word line 22 is at the selection state at the H level, the access transistors 42a and 42b of the memory cell 24a are both conductive. Therefore, a direct current flows through such a path as the power source 18→the bit line load 25b→the bit line 20b→the access transistor 42b→the driver transistor 41b→the ground. However, since the driver transistor 41a is not conductive, the direct current does not flow through the other path such as the power source 18→the bit line load 25a→the bit line 20a→the access transistor 42a→the driver transistor 41a→the ground. At this time, a potential on the bit line 20a, through which the direct current does not flow, becomes (a supply potential - Vth) if threshold voltages of the bit line load transistors 25a, 25b, 26a and 26b are Vth. Furthermore, a potential on the bit line 20b, through which the direct current flows, is divided by conductive resistances of the driver transistor 41b, the access transistor 42b and the bit line load 25b, and consequently, the potential decreases by $\Delta V$ from the value of (the supply potential - Vth) to be the value of (the supply potential - Vth - $\Delta V$). The $\Delta V$ is called a bit line amplitude, which is normally about 50 mV-500 mV and is controlled depending on the magnitude of the bit line load.

This bit line amplitude appears on the I/O lines 29a and 29b through the conductive transfer gates 27a and 27b to be amplified by the sense amplifier 9. After further amplified in the output buffer 10, the bit line amplitude is read from the output terminal 11 as a data output. In reading, the input data buffer 13 is controlled by the read/write control circuit 16 so as not to drive the I/O line pair 29a, 29b.

Meanwhile, in writing, the potential on the bit line, in which data of the L level is to be written, is forced to be lowered to a lower potential, and the potential on the other bit line is raised to a higher potential, thereby carrying out data writing in the memory cell. For writing inverted data in the memory cell 24a, for example, the data input buffer 13 makes the I/O line 29a be at the L level and the other I/O line 29b be at the H level. Accordingly, the bit line 20a goes to the L level and the other bit line 20b goes to the H level, and thus the data is written.

Since the conventional semiconductor memory device is configured as described above, all the memory cells in the same row are activated to let a current flow therein from the power source, whereby there has been a disadvantage, especially in the configuration of a large capacity semiconductor memory device, that current consumption increases throughout the device.

Furthermore, in the large capacity semiconductor memory device, an increase in length of a word line causes an increase in resistance of the word line, as a whole, formed of such as polysilicon, molybdenum silicide or tungsten silicide having higher resistance than a metal, and furthermore, the increased number of the memory cells connected to the same word line causes an increased capacitive load. Consequently, a delay time on the word line is increased, resulting in another disadvantage that a high speed access cannot be performed.

In order to eliminate these disadvantages, a second conventional example of the semiconductor memory device is proposed as shown in FIG. 4, which is, for example, disclosed in Japanese Patent Laying Open No. 58-211393 and the U. S. Pat. No. 4,542,486. This semiconductor memory device comprises N memory cell groups formed by dividing in a column direction a memory cell array formed of memory cells arranged in matrix, memory cell group selecting lines for each selecting the corresponding one of the N memory cell groups, row decoders for each decoding a row address signal of the memory cell group to be accessed, preceding word lines each connected to an output terminal of the corresponding one of the row decoders, AND function gates for each taking a logical product of a selecting signal on the memory cell group selecting line and an output signal on the preceding word line, and word lines connected to output terminals thereof. The preceding word lines and the latter word lines are arranged in parallel to each other in a row direction.

FIG. 4 shows as one example of the described semiconductor memory device, the case that the memory cell array is divided into N (3) blocks in the column direction to form N (3) memory cell groups 51a-51c.

Referring to FIG. 4, memory cell group selecting lines 52a-52c select corresponding memory cell groups 51a-51c, respectively. A plurality of preceding word lines 55 are connected to outputs of row decoders 54 and are arranged in parallel in one direction. Furthermore, a plurality of AND function gates 56a-56c are provided with their inputs connected to the preceding word lines 55 and the memory cell group selecting lines, respectively. Word lines 53a-53c are connected to the respective outputs of these gates.

An operation of a second conventional example of this semiconductor memory device will now be described. As shown in FIG. 4, the word line 53a in the memory cell group 51a, for example, is activated by a switching gate 56a receiving as its inputs a signal on the preceding word line 55 as a row-selecting line and a signal on the memory cell group selecting line 52a running vertically to the preceding word line 55. In the device of FIG. 4, the time to select a particular row is determined by a delay time on the preceding word line 55 and that on the word line 53a.

A capacitance of the preceding word line 55 does not include a gate capacitance which is the sum of the gate-drain capacitance, gate-source capacitance and gate-substrate capacitance of the respective access transistors 42a and 42b in each of the memory cells, so that the capacitance of the preceding word line 55 is considerably smaller than a capacitance of a conventional word line including these capacitances. Furthermore, the word line 53a is short such that CR delay thereon can be ignored. Therefore, the time to select the row can substantially be reduced compared to the conventional by employing this second conventional example.

In addition, since the preceding word line 55 does not constitute a gate electrode, a material of the preceding word line 55 as the row-selecting line can be selected irrelevant to a work function and can further employ various low resistance materials.

Moreover, only the memory cell connected to a single word line 53a in the selected memory cell group are only accessed, in this second conventional example, so that an ineffective current flowing into the memory cells from the load transistors of the bit lines can be reduced to the amount of 1/(the number of blocks) compared to the conventional, and thus power consumption can be reduced at the same time.

However, since the semiconductor memory device according to the second conventional example is configured as aforementioned, the number of AND function gates 56 connected to a single preceding word line 55 increases and also the length of the preceding word line 55 itself increases in a larger capacity semiconductor memory device, in which a memory cell array need be divided into a large number of blocks for lower power consumption. Accordingly, there was a disadvantage that capacitance and resistance of the preceding word line 56 increase so that a delay on the preceding word line 55 increases.

Furthermore, since the large capacity semiconductor memory device requires a large number of divided blocks of the memory cell array for lower power consumption as described above, the capacitance of the preceding word line 55 is increased, and thus a MOS transistor of the row decoder 54 for driving the preceding word line 55 operates in a saturation region over a long period of time. As a result, a problem in reliability of the semiconductor memory device arose as follows: Due to an effect so-called a hot electron effect that an intensity of an electric field is increased in a channel region of a miniaturized MOS transistor to let electrons flow in a gate oxide film, thereby raising a threshold value of the transistor, a threshold voltage of the MOS transistor fluctuates in time and thus the access time in the semiconductor memory device shifts. Therefore due to this disadvantage as pointed out above, it is impossible in the large capacity semiconductor memory device that the memory cell array is divided into multi-blocks.

In addition, another problem arose in reliability of the large capacity semiconductor memory device that due to increased capacitance of the preceding word line 55 which causes an increased charge/discharge current to flow through the word line 55, migration of aluminum and then a disconnection occur particularly in the case of the preceding word line formed of aluminum metal.

SUMMARY OF THE INVENTION

It is an object of the present invention to substantially reduce an access time of a large capacity semiconductor memory device.

It is another object of the present invention to reduce power consumption of the large capacity semiconductor memory device.

It is a further object of the present invention to enhance reliability of the large capacity semiconductor memory device.

It is a still further object of the present invention to reduce a delay on a row-selecting line by reducing capacitance and resistance of the row-selecting line.

It is a further object of the present invention to prevent a fluctuation in the access time of the semiconductor device due to a hot electron effect by reducing capacitance of the row-selecting line.

It is a still further object of the present invention to reduce a charge/discharge current flowing through the row-selecting line to prevent a disconnection of the row-selecting line by reducing capacitance of the row-selecting line.

To summarize, a semiconductor memory device according to the present invention comprising: a memory cell array formed of a plurality of memory cells arranged in matrix, the memory cell array being divided in a column direction into a plurality of large memory cell groups, each of the plurality of large memory cell groups being further divided in the column direction into a plurality of small memory cell groups; the semiconductor memory device further comprising: a plurality of first row-selecting lines provided in the memory cell array, a plurality of second row-selecting lines provided in each of the plurality of large memory cell groups, a plurality of word lines connected to the memory cells provided in each of the plurality of small memory cell groups, signal lines for each supplying a first selecting signal for selecting the corresponding one of the plurality of large memory cell groups, signal lines for each supplying a second selecting signal for selecting the corresponding one of the plurality of small memory cell groups, first decoders each responsive to an internal address signal for selecting the corresponding one of the first row-selecting lines and activating the same, a plurality of second decoders provided for each large memory cell group for each selecting a second row-selecting line in association with the selected first row-selecting line and activating the same in the large memory cell group selected by the first selecting signal, and a plurality of third decoders provided for each small memory cell group for each selecting a word line in association with the selected second row-selecting line and activating the same in the small memory cell group selected by the second selecting signal.

It is a main advantage of the present invention that in a large capacity semiconductor memory device, capacitance and resistance of each of the row-selecting lines can further be reduced by separately providing the row-selecting lines and word lines and by dividing each of the row-selecting lines into a first row-selecting line and second row-selecting lines, resulting in a higher access speed and an enhanced reliability in operation.

It is another advantage of the present invention that the total number of load gates to be driven in one cycle of the operation of the semiconductor memory device can further be reduced, resulting in more reduction in power consumption.

It is a further advantage of the present invention that materials of and manufacturing processes of the word lines and the word selecting lines can be selected in a wider range.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First of all, the configuration of a semiconductor memory device according to a first embodiment of the present invention will be described with reference to FIGS. 5 and 6.

Figure 5:
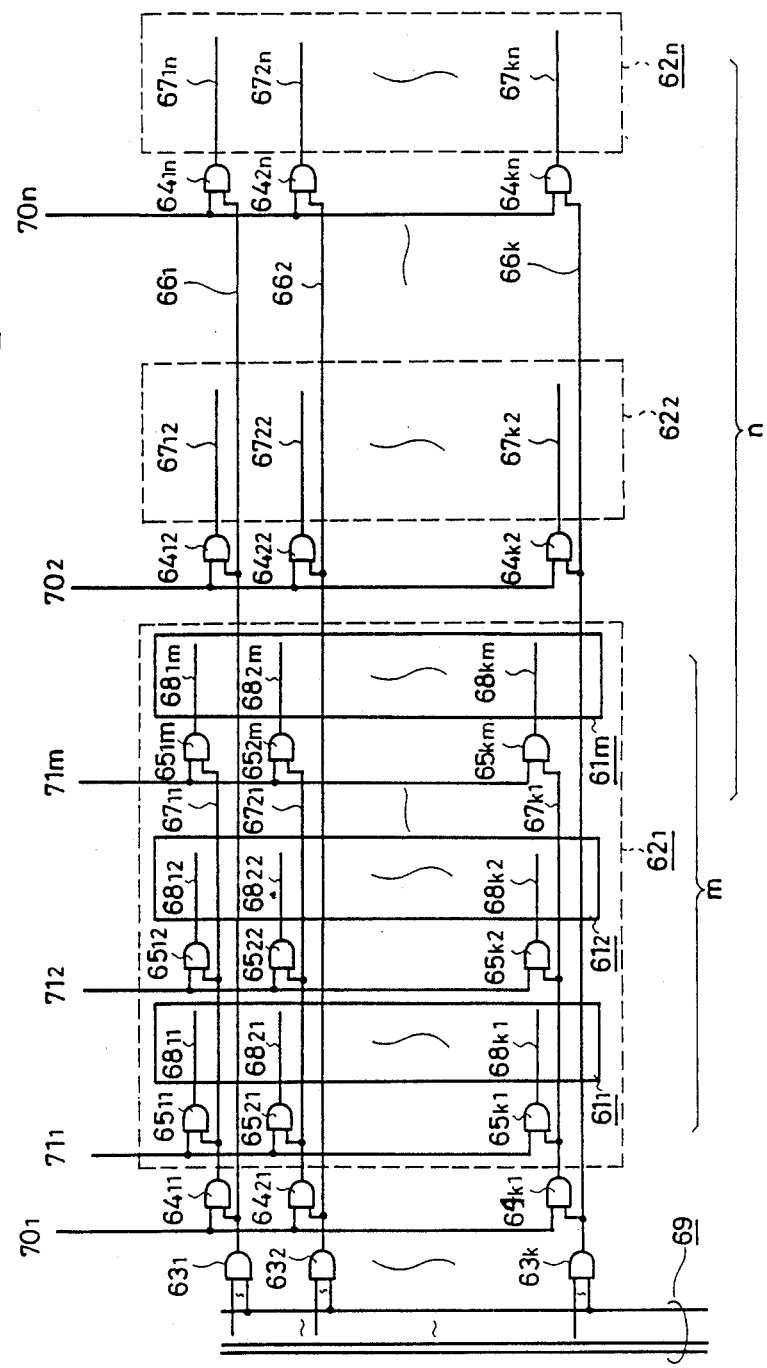
FIG. 5 is a block diagram illustrating a semiconductor memory device according to a first embodiment of the present invention.
Figure 6:
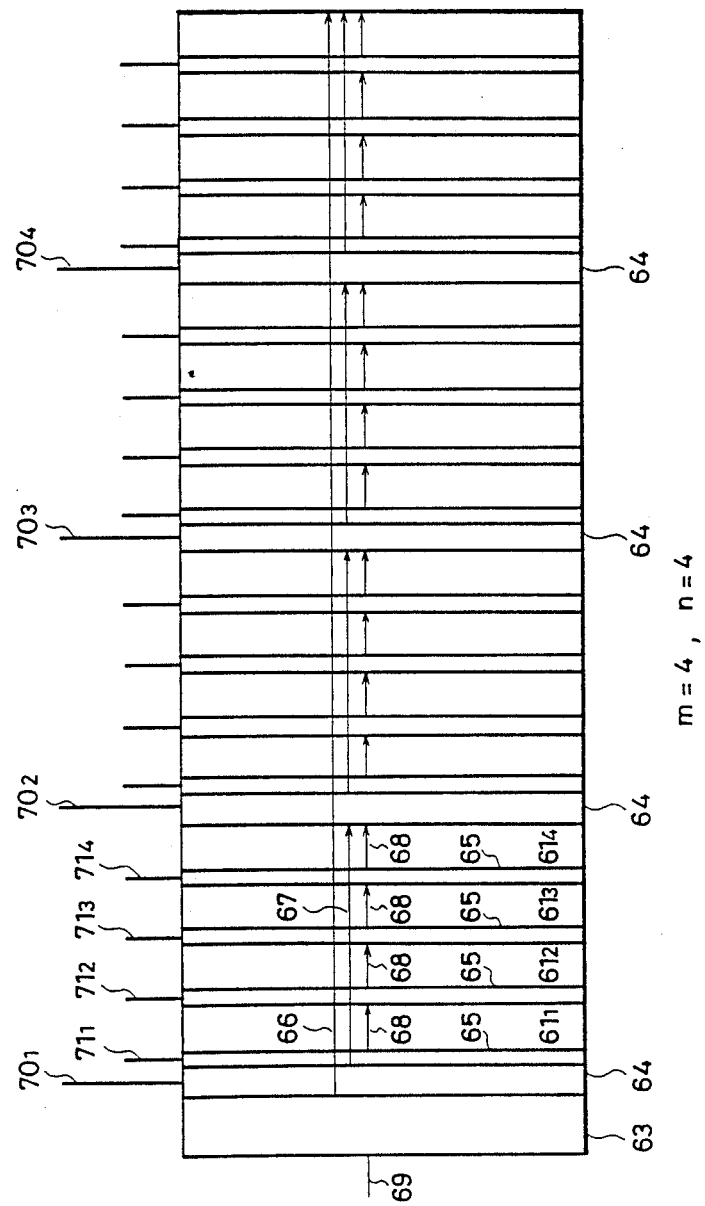
FIG. 6 is a diagram illustrating a physical layout of the embodiment shown in FIG. 5.

Referring to FIGS. 5 and 6, a memory cell array 7 formed of a plurality of memory cells (not shown) arranged in matrix is first divided into n large memory cell groups $62_1, 62_2, \ldots, 62_n$, and each of the large memory cell groups is further divided into m small memory cell groups (e.g., $61_1, 61_2, \ldots, 61_m$ in the large memory cell group $62_1$).

An internal address signal line group 69 is connected with main global decoders $63_1, 63_2, \ldots, 63_k$, which are AND function gates, respectively. Main row-selecting lines $66_1, 66_2, \ldots, 66_k$ are connected to the respective outputs of the main global decoders and are arranged in parallel in one direction. Furthermore, there are provided large memory cell group selecting lines $70_1, 70_2, \ldots, 70_n$ and also a plurality of sub global decoders $64_{11}, 64_{12}, \ldots, 64_{kn}$, which are AND function gates, each receiving as inputs the main row-selecting line and the large memory cell group selecting line.

Sub row-selecting lines $67_{11}, 67_{21}, \ldots 67_{kn}$ are connected to the respective outputs of the sub global decoders and are arranged in parallel in one direction. Furthermore, for each large memory cell group, there are provided small memory cell group selecting lines (e.g., $71_1, 72_2, \ldots, 71_m$ in the large memory cell group $62_1$) supplied with a signal produced by decoding a column address signal, and further a plurality of local decoders $65_{11}, 65_{12}, \ldots, 65_{km}$ serving as AND function gates each receiving the sub row-selecting line and small memory cell group selecting line as inputs. Word lines $68_{11}, 68_{12}, \ldots, 68_{km}$ divided to be connected to the respective memory cells are connected to the respective outputs of the local decoders and are arranged in parallel in one direction.

A physical layout of the above described semiconductor memory device is not specifically limited; however, in order to make the device simple and operable faster, the main global decoders $63_1$–$63_k$, the sub global decoders $64_{11}$–$64_{kn}$ and the local decoders $65_1$–$65_{km}$ are provided near end portions of the memory cell array 7, the large memory cell groups $62_1$–$62_n$ and the small memory cell groups $61_1$–$61_m$, respectively, which are close to a signal source, as shown in FIG. 6 according to this embodiment. Moreover, the main global decoders $63_1$–$63_k$ are, for faster operation, provided close to address input terminals.

The operation of the first embodiment will now be described.

A description will be given, for example, on the case of selecting the divided word line $68_{11}$ connected to memory cells in the small memory cell group $61_1$ shown in FIG. 5. In this case, an internal address signal is first applied to the main global decoder $63_1$ via an internal address signal line group 69, and in response to this, the decoder $63_1$ selects the main row-selecting line $66_1$. Furthermore, the sub global decoder $64_{11}$ receives as inputs a row-selecting signal on the main row-selecting line $66_1$ and a signal on the large memory cell group selecting line $70_1$ for selecting the large memory cell group $62_1$ which this small memory cell group $61_1$ belongs to, and in response to this, the decoder $64_{11}$ selects the sub row-selecting line $67_{11}$. Further, the local decoder $65_{11}$ receives as inputs a row-selecting signal on the sub row-selecting line $67_{11}$ and a signal on the small memory cell group selecting signal line $71_1$ for selecting this small memory cell group $61_1$, and in response to this, the decoder $65_{11}$ selects the divided word line $68_{11}$.

In the first embodiment, the time required for selecting the divided word line $68_{11}$ in the above described manner is determined by delay times on the main row selecting line $66_1$, the sub row-selecting line $67_{11}$ and the divided word line $68_{11}$.

Figure 3A:
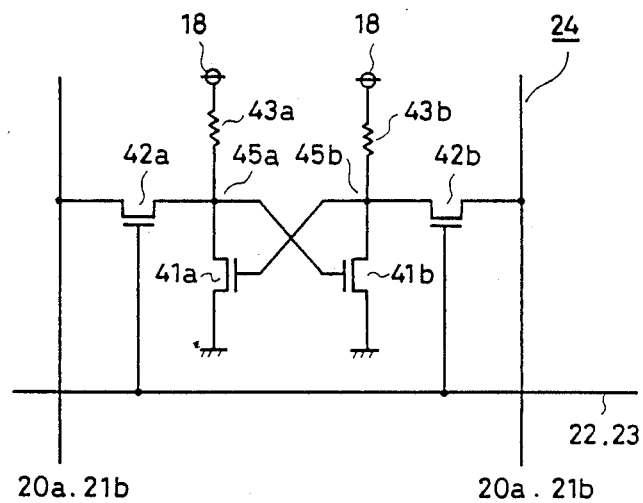
FIGS. 3A and 3B are circuit diagrams illustrating detailed examples of the memory cell in FIG. 2.
Figure 3B:
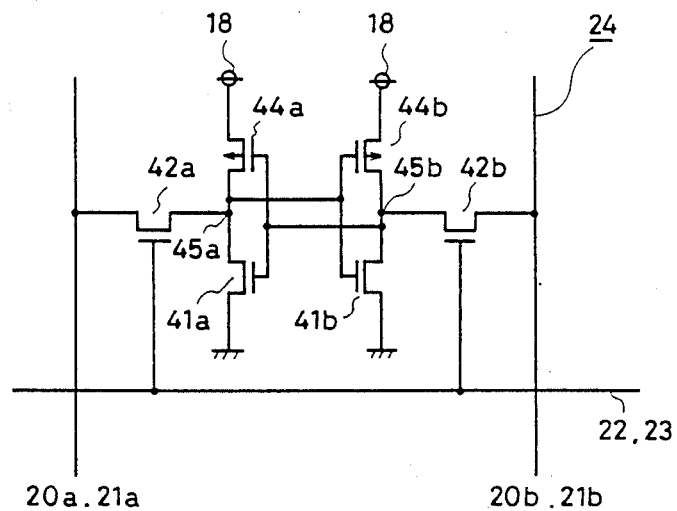

First of all, neither the main row-selecting line $66_1$ nor the sub row-selecting line $67_{11}$ is directly connected to the memory cell, so that capacitance of these row-selecting lines does not include a gate capacitance which is the sum of a gate-drain capacitance, a gate-source capacitance and a gate-substrate capacitance of the access transistors $42a$, $42b$ (FIG. 3) of the memory cell, either in the described semiconductor memory device of the second conventional example.

Figure 4:
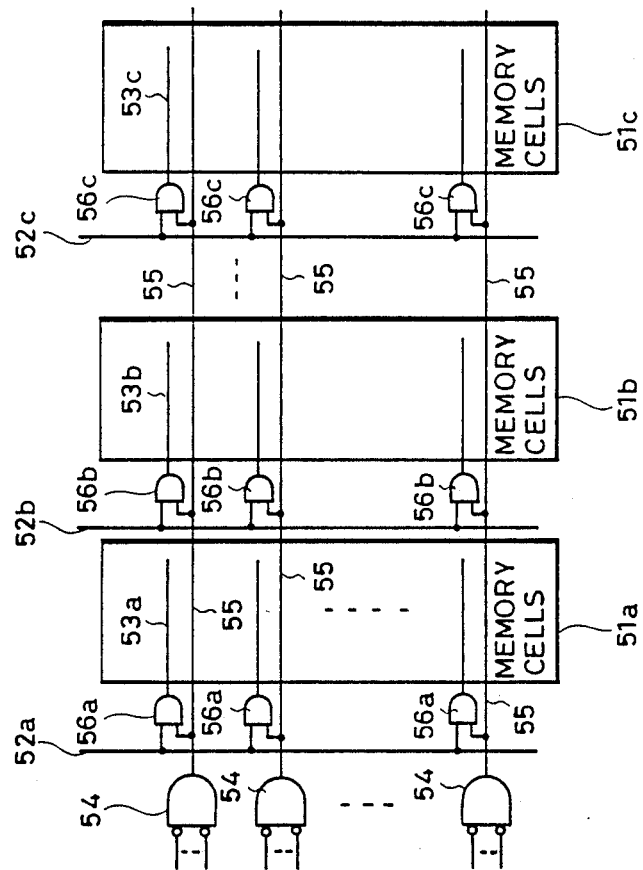
FIG. 4 is a block diagram illustrating a second conventional example of the semiconductor memory device.

Such case will now be described that the memory cell array is divided into n large memory cell groups, and further each of the large memory cell groups is divided into m small memory cell groups as mentioned above, i.e., the case that the entire memory cell array is divided into small memory cell groups of m×n. As the configuration of the second conventional example shown in FIG. 4 is employed for the configuration that the entire memory cell array is divided into mn small memory cell groups, the number of output load gates connected to each preceding word line becomes apparently m×n. However, in a hierarchical configuration that the conventional preceding word lines are further divided into the main row-selecting lines and the sub row-selecting lines, the number of the output load gates of each of the main row-selecting lines $66_1$–$66_k$ is n, and the number of the output load gates of each of the sub row-selecting lines $67_{11}$–$67_{kn}$ is m, as shown in FIG. 5. That is, the capacitance of each main row-selecting line and that of each sub row-selecting lines are in proportion to n, the number of the large memory cell groups and m, the number of the small memory cell groups therein, respectively. Since m and n are both natural numbers of 2 or more, the following inequalities are given:

$$m \leq mn, n \leq mn$$

Therefore, the capacitance of each of the main row-selecting lines and that of each of the sub row-selecting lines become smaller than the capacitance of the preceding word line of the second conventional example, which is proportional to m×n, the total number of the small memory cell groups.

Accordingly, by making the configuration of the preceding word lines 55 of the second conventional example into a double hierarchy configuration of the main row-selecting lines $66_1$–$66_k$ and the sub row-selecting lines $67_{11}$–$67_{kn}$ as in the first embodiment, the total number of load gates to be driven in one cycle becomes (m+n), which is less than the mn in the second conventional example, as shown in the following inequality:

$$m + n < mn$$

Therefore, the capacitance of the row selecting lines can be reduced as a whole, resulting in a reduced delay time on the main row-selecting lines and sub row-selecting lines and thus an increased access speed.

According to the first embodiment, the number of stages of gates for achieving decode functions is larger by one stage than in the described second conventional example, thereby causing a delay corresponding to one stage. However, as discussed in the article entitled "An Optimized Output Stage for MOS Integrated Circuits" by HUNG CHANG LIN et al in the "IEEE JOURNAL OF SOLID-STATE CIRCUITS", 1975 April, pp. 106-109 and that in 1975 June, pp. 185-186, in a large capacity semiconductor memory device of 4M bits or more, for example, a delay caused by the increased number of the output load gate is greater than a delay caused by the increased number of the stages of decode circuitry. Therefore, according to the first embodiment of the present invention, the time to select the memory cell can be substantially reduced compared to the that in the conventional semiconductor memory device.

Furthermore, since the capacitance of the row-selecting lines is substantially reduced, the MOS transistor for driving such large capacitance as in the second conventional example is no longer required, whereby it becomes possible to prevent a fluctuation in the access time due to the hot electron effect and also to decrease a possibility of a disconnection due to the migration of aluminum. Therefore, according to the first embodiment of the present invention, the large capacity semiconductor memory device can attain an enhanced reliability.

In addition, the total number of the load gates to be driven in one cycle decreases in comparison with that in the second conventional example, thereby decreasing the power consumption due to charging/discharging, which is proportional to the expression of (frequency)×(capacitance)×(voltage)$^2$, and thus further decreasing the power consumption in the large capacity semiconductor memory device.

Such reduction in the power consumption inhibits generation of heat in a chip and thus a raise in temperature of the chip. As a result, a further reduction is achieved in the access time of the semiconductor memory device.

Moreover, since a switching current flowing through the row-selecting lines due to charging/discharging is decreased, noise occurring in a power source and on a ground line and a signal line decreases, thereby implementing an electrically stabilized semiconductor memory device.

Furthermore, since the divided word lines $68_{11}$-$68_{km}$ can have their lengths reduced by multi-division of the memory cell array, the CR delay thereon becomes shorter than that in the conventional example, thereby also achieving a further reduction in the access time of the semiconductor memory device.

Since the device can achieve high speed access even with a high resistance rate of a material of the divided word lines $68_{11}$-$68_{km}$ due to the reduction in length thereof, materials of and manufacturing processes of the divided word lines can be selected in a wider range. Consequently, a manufacturing process focused on production yield can be selected, resulting in the semiconductor memory device of a more reduced production cost than that in the conventional example.

In addition, neither the main row-selecting lines $66_1$-$66_k$ nor the sub row-selecting lines $67_{11}$-$67_{kn}$ constitute gate electrodes of the access transistors, so that the materials of these row-selecting lines can be selected irrespectively of a work function. That is, the row selecting lines can employ various row resistance materials such as molybdenum silicide, tungsten silicide, molybdenum, tungsten, aluminum and so on in the wider range of selecting the materials. As a result, since the manufacturing process focused on the production yield can be selected, the manufacturing cost of the semiconductor memory device can be more reduced than in the conventional example.

Furthermore, in the semiconductor memory device according to the first embodiment of the present invention, only the memory cells are accessed which are connected to a selected one of the plurality of divided word lines $68_{11}$-$68_{km}$ in the selected large memory cell group, so that an ineffective current flowing in the memory cells from the load transistor of the bit lines can be reduced to 1/(the number of small memory cell groups)=1/(m×n) in comparison with the first conventional example as described above. Such accomplishment of the low power consumption in the semiconductor memory device of the first embodiment is similar to that in the second conventional example; however, since it is possible to divide the memory cell array into multi-blocks, that is, to increase the number of the small memory cell groups for the described reason, the device in the first embodiment can have much lower power consumption than that in the second conventional example. The present invention is extremely effective particularly in a CMOS semiconductor memory device because a large amount of DC current flow into the memory cell.

Furthermore, in the semiconductor memory device according to the first embodiment of the present invention, only the memory cells are accessed which are connected to a selected one of the plurality of divided word lines $68_{11}$-$68_{km}$ in the selected large memory cell group, and also the memory cell array can be divided into multi-blocks, so that a very few memory cells are accessed. Therefore, a soft error rate increased by a read operation is drastically decreased, resulting in a further enhancement in reliability of the semiconductor memory device.

Figure 7:
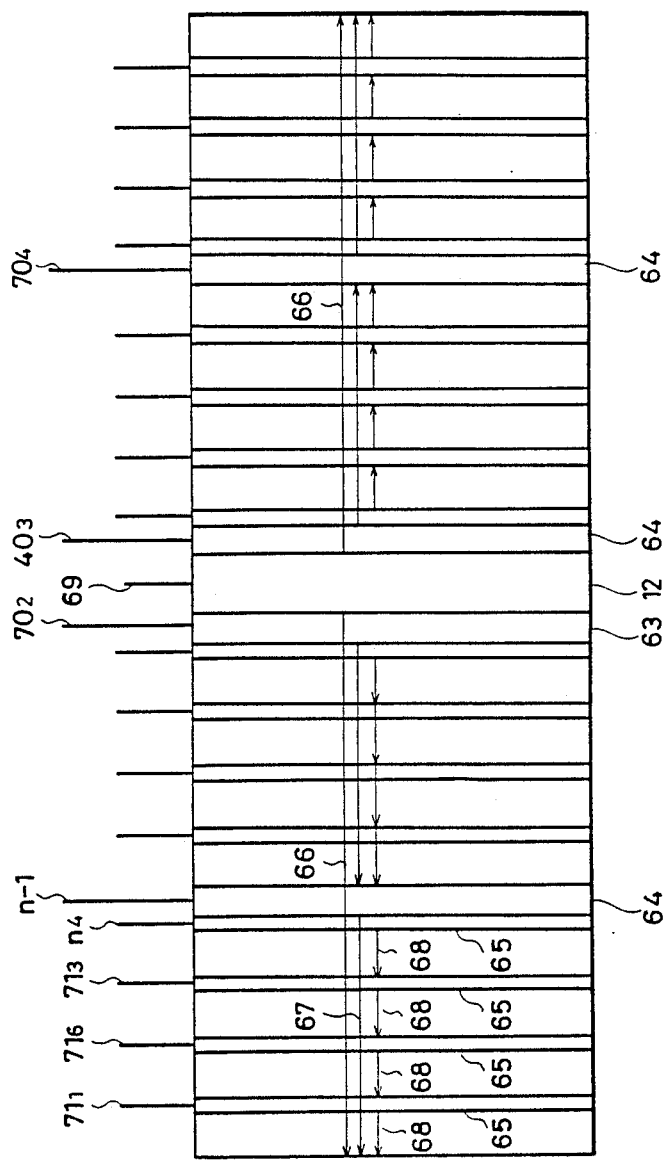
FIG. 7 is a diagram illustrating a physical layout of a semiconductor memory device according to a second embodiment of the present invention.

Next, a second embodiment of the present invention will be described with reference to FIG. 7. In this embodiment, the main global decoders $63_1$-$63_k$ are provided at the intermediate portion of the memory cell array in order to reduce the length of each of the main row-selecting lines 66. In this case, a layout of the sub global decoders $64_{11}$-$64_{kn}$ and the local decoders $65_{11}$-$65_{km}$ is not specifically limited; however, these decoders are provided at the end portions, close to the signal source, of the large memory cell groups $62_1$-$62_n$ and the small memory cell groups $61_1$-$61_m$, respectively, for a high speed operation. According to the second embodiment, a further reduction in the access time can be accomplished in addition to the various effects of the first embodiment. Moreover, if the main row-selecting lines at the left portion and those at the right portion in FIG. 7 are configured to be selectively driven independently, the capacitance of the main row-selecting lines can further be reduced, resulting in a higher access speed, reduced power consumption and enhanced reliability of the device.

A third embodiment of the present invention will then be described with reference to FIG. 8. In this embodiment, the sub global decoders $64_{11}$-$64_{kn}$ are provided at the intermediate portions of the large memory cell groups $62_1$–$62_n$, respectively, in the layout of the memory cell array in FIGS. 6 and 7 in order to reduce the length of each of the sub row-selecting lines 67. In this case, the layout of the local decoders $65_{11}$–$65_{km}$ is not specifically limited; however, they are provided at the end portions, close to the signal source, of the small memory cell groups $61_1$–$61_m$, respectively, for a high speed operation. According to the third embodiment, a further reduction in the access time can be achieved in addition to effects of the first and second embodiments.

Figure 8:
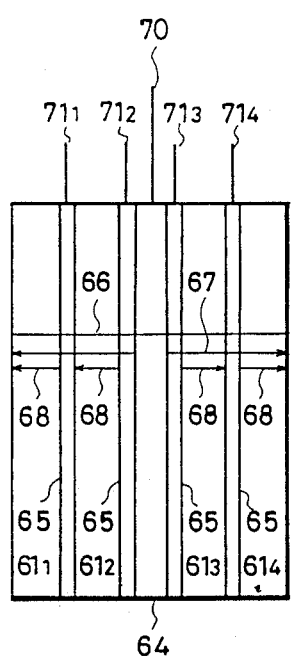
FIG. 8 is a diagram illustrating a physical layout of a semiconductor memory device according to a third embodiment of the present invention.

Furthermore, if the sub row-selecting lines at the left portion and those at the right portion in FIG. 8 are configured to be selectively driven independently, the capacitance of the sub row-selecting lines can be reduced, resulting in the higher access speed, the reduced power consumption and the enhanced reliability of the device.

Figure 1:
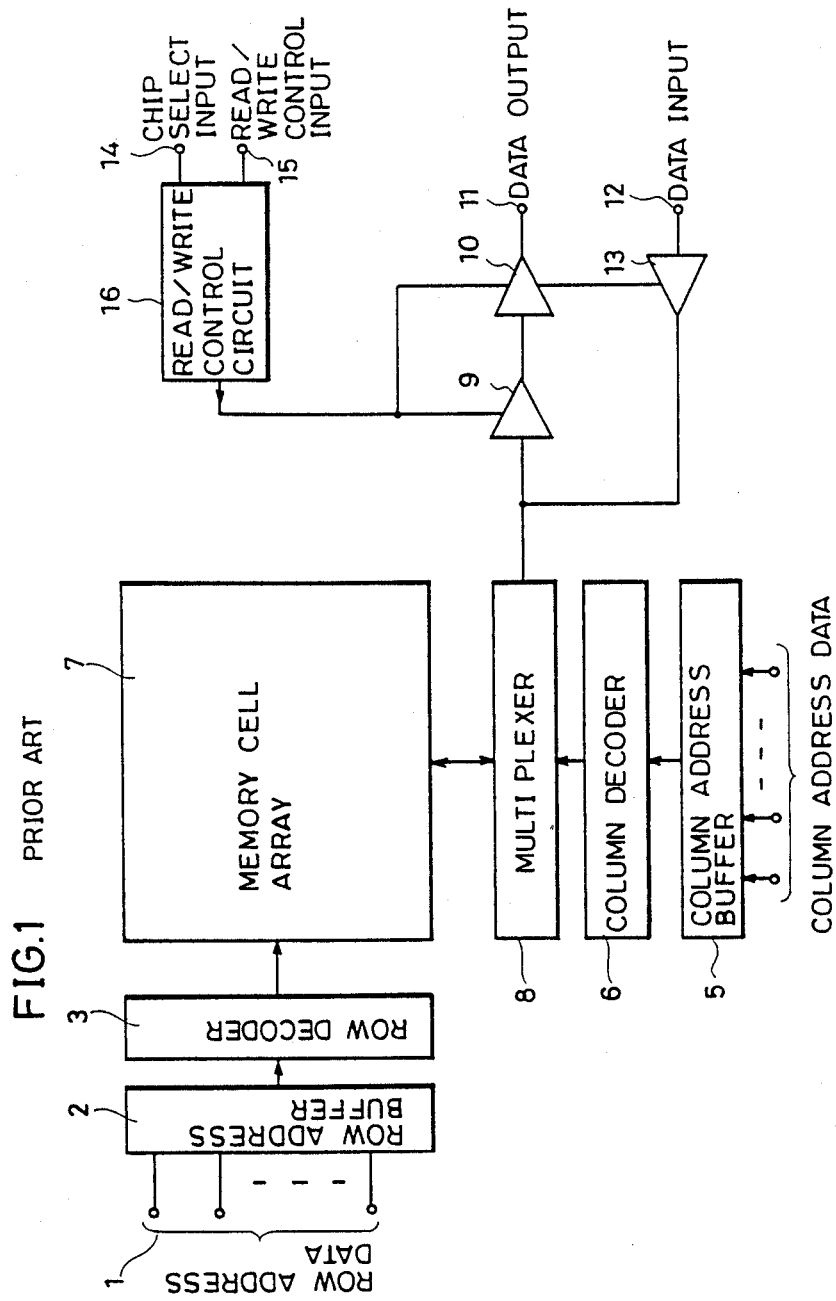
FIG. 1 is a block diagram illustrating a first conventional example of a semiconductor memory device.
Figure 2:
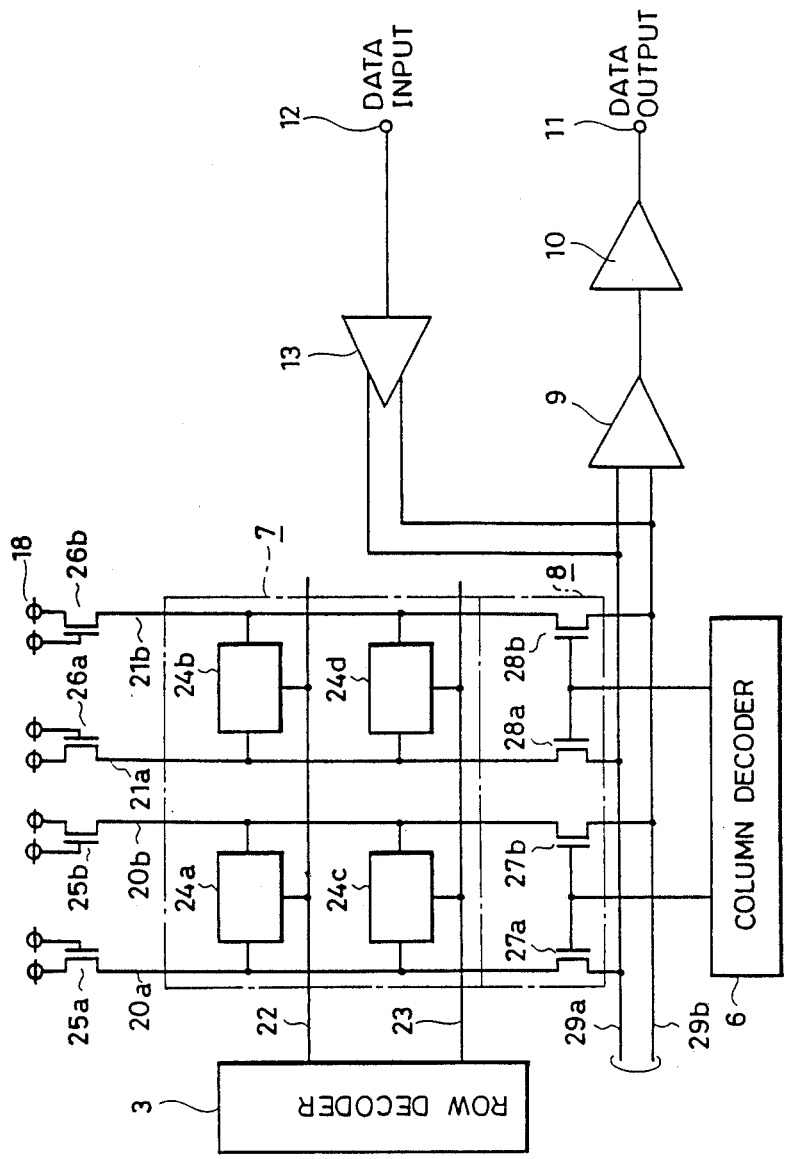
FIG. 2 is a diagram illustrating the configuration of the periphery of a memory cell array in the semiconductor memory device shown in FIG. 1.
Figure 9:
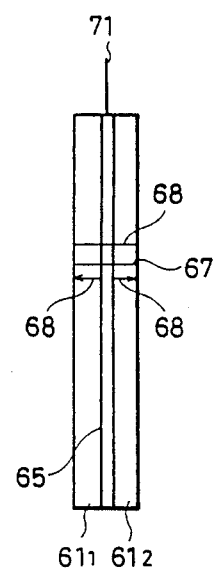
FIG. 9 is a diagram illustrating a physical layout of a semiconductor memory device according to a fourth embodiment of the present invention.

Next, a fourth embodiment of the present invention will be described with reference to FIG. 9. In this embodiment, the local decoders $65_{11}$–$65_{km}$ are provided at the intermediate portions of the respective small memory cell groups in the layout of the memory cell array in FIGS. 2, 3 and 4 in order to reduce the length of each of the divided word lines 68. According to this embodiment, the access time can further be reduced in addition to the various effects of the first, second and third embodiments.

Furthermore, if the respective divided word lines at the left portion and those at the right portions in FIG. 9a can be selectively driven independently, the capacitance of the divided word lines can be more reduced and the number of the memory cells to be activated decreases, so that the higher access speed, the decreased power consumption and the enhanced reliability can be achieved.

Next, a description will be given on the configuration of the semiconductor memory device according to a fifth embodiment of the present invention with reference to FIG. 10.

Figure 10:
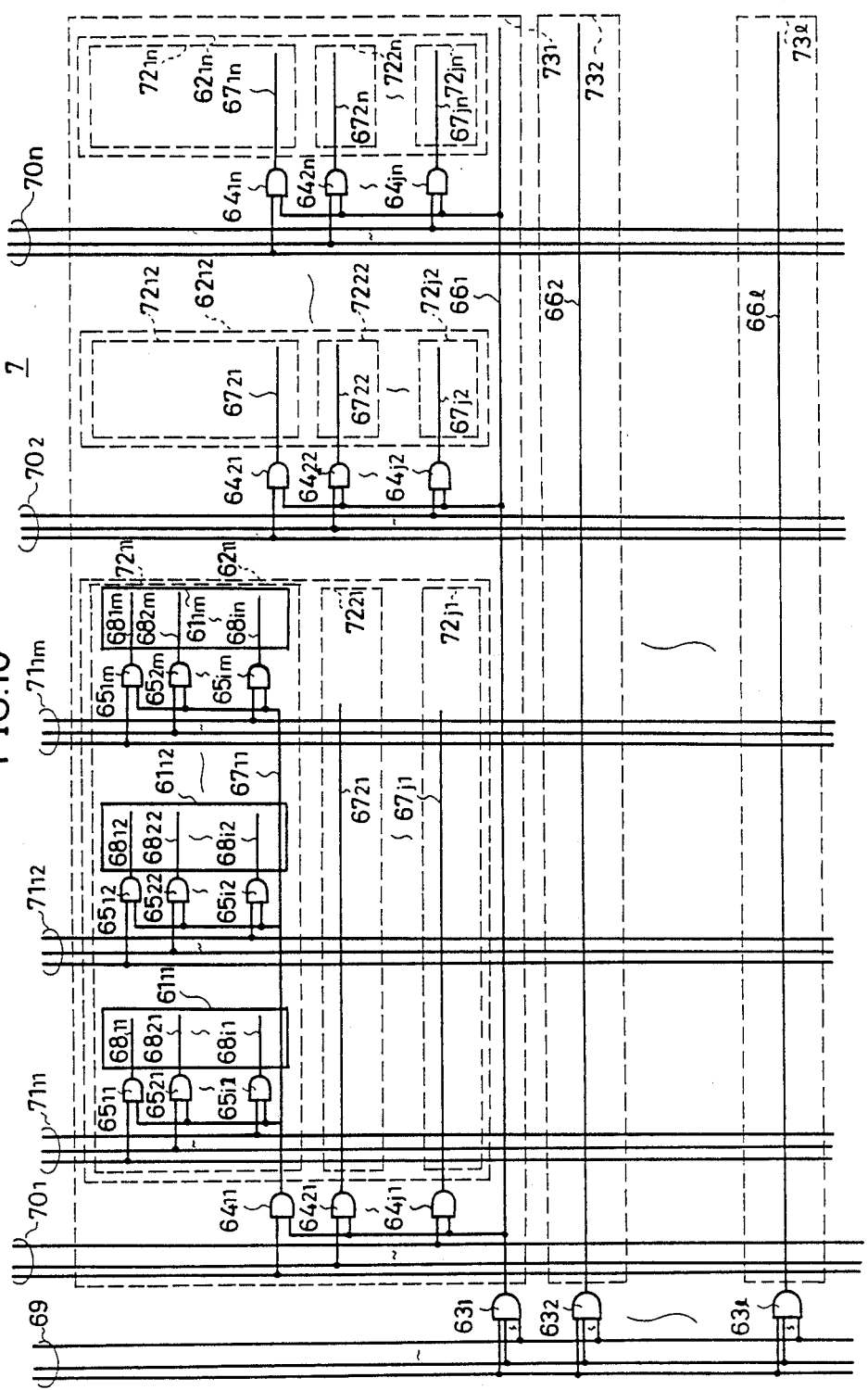
FIG. 10 is a block diagram illustrating a semiconductor memory device according to a fifth embodiment of the present invention.

Referring to FIG. 10, a memory cell array 7 formed of a plurality of memory cells (not shown) rings in matrix is first divided into l large memory cell row groups (each formed of ij rows) $73_1$–$73_l$, and each of the large memory cell row groups is further divided into n large memory cell groups (e.g., $62_{11}$–$62_{1n}$ in the large memory cell row group $73_1$). Each of the large memory cell groups $62_{11}$–$62_{1n}$ is divided into small memory cell row groups (each formed of i rows) $72_{11}$–$72_{j1}$, and each of the small memory cell row groups is further divided into m small memory cell groups (e.g., $61_{11}$–$61_{1m}$ in the small memory cell row group $72_{11}$).

Main global decoders $63_1$–$63_l$ serving as AND function gates are connected to an internal address signal line group 69 and their outputs connected to main row selecting lines $66_1$–$66_l$, respectively, and then arranged in parallel in one direction. Each of the main global decoders selects i×j rows collectively.

In addition, there are provided large memory cell group selecting lines $70_1$–$70_n$ for selecting the plurality of large memory cell groups arranged in one column and one of the small memory cell row groups in each of the large memory cell groups, and a plurality of sub global decoders $64_{11}$–$64_{jn}$, which serve as AND function gates, receiving as their inputs the main row selecting lines and the large memory cell group selecting lines. The sub global decoders have their outputs connected to sub row-selecting lines $67_{11}$–$67_{jn}$, respectively, and are arranged in parallel in one direction. Each of the sub global decoders selects i rows collectively.

Furthermore, there are provided small memory cell group selecting lines $71_{11}$–$71_{1m}$ for selecting the plurality of small memory cell groups arranged in one column and one row of each of the small memory cell groups, and a plurality of local decoders $65_{11}$–$65_{im}$, which serve as AND function gates, receiving as their inputs sub row-selecting lines and the small memory cell group selecting lines. The local decoders have their outputs connected to divided word lines $68_{11}$–$68_{im}$ connected to the memory cells, respectively, and are arranged in parallel in one direction. The small memory cell group selecting signal lines $71_{11}$–$71_{1m}$ are supplied with signals obtained by decoding row address data and column address data.

A physical layout of the described semiconductor memory device is not specifically limited; however, for simplification in this embodiment, the main global decoders $63_1$–$63_l$, the sub global decoders $64_{11}$–$64_{jn}$ and the local decoders $65_{11}$–$65_{im}$ are provided at the end portions, close to a signal source, of the memory cell array 7, the large memory cell groups $62_{11}$–$62_{1n}$ and the small memory cell groups $61_{11}$–$61_{1m}$, respectively. Also in this embodiment, the main global decoders $63_1$–$63_l$ are provided close to address input terminals for a higher speed of access.

An operation of the fifth embodiment will now be described.

A description will be given, for example, on the case that the divided word line $68_{11}$ connected to the memory cells in the small memory cell group $61_{11}$ in FIG. 10. In this case, an internal address signal is first applied to the main global decoder $63_1$ via the internal address signal line group 69, and in response to this, the decoder $63_1$ selects the main row-selecting line $66_1$ corresponding to the large memory cell row group $73_1$. Further, the sub global decoder $64_{11}$ receives as its input a row-selecting signal on the main row-selecting line $66_1$ and a signal on the large memory cell group selecting line $70_1$ for selecting the large memory cell group $62_{11}$ and the small memory cell row group $72_{11}$, respectively, which the small memory cell group $61_{11}$ belongs to, and in response to this, the decoder $64_{11}$ selects the sub row-selecting line $67_{11}$. Further, the local decoder $65_{11}$ receives as its input a row selecting signal on the sub row-selecting line $67_{11}$ and a signal on the small memory cell group selecting line $71_{11}$ for selecting the row of the small memory cell group $61_{11}$, respectively, which the memory cell belongs to, and in response to this, the decoder $65_{11}$ selects the divided word line $68_{11}$.

According to this embodiment, the number of the main global decoders $63_1$–$63_l$ decreases to 1/(ij) compared to that in the first embodiment, and the number of the sub global decoders $64_{11}$–$64_{jn}$ decreases to 1/i, so that power consumption is further reduced in addition to the various effects of the first embodiment.

Moreover, according to this embodiment, the number of the main row-selecting lines $66_1$–$66_l$ and of the sub row-selecting lines $67_{11}$–$67_{jn}$ decreases, so that even if both or either of these lines is provided between the memory cells, an increase in a chip area is negligible. Also in this case, the capacitance of the main row-selecting lines $66_1$–$66_l$ and of the sub row-selecting lines $67_{11}$–$67_{jn}$ decreases, so that the access time can further be reduced in addition to the various effects of the first embodiment.

Furthermore, according to the fifth embodiment, the number of intersections between bit lines and the main row-selecting lines $66_1$–$66_l$ and sub row-selecting lines $67_{11}$–$67_{jn}$ decreases, so that the capacitance of the bit lines decreases. Therefore, a further reduction in the access time can be achieved in addition to the numerous effects of the first embodiment.

The decrease in the number of the intersections as above causes a decrease in the number of short circuits of the bit lines to the main row-selecting lines $66_1$–$66_l$ and the sub row-selecting lines $67_{11}$–$67_{jn}$, resulting in a higher production yield. Consequently, a manufacturing cost of the semiconductor memory device can be reduced in addition to the numerous effects of the first embodiment.

Moreover, combinations of the fifth embodiment and the described second, third, and fourth embodiments cause a higher access speed, the more reduced power consumption and the higher reliability of the device.

Figure 11A:
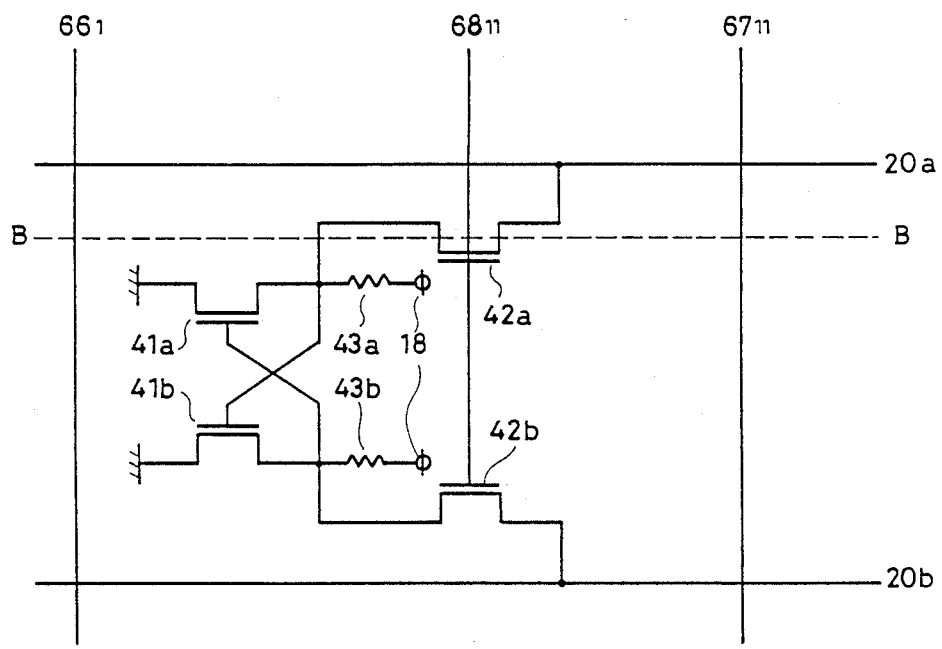
FIG. 11A is a diagram illustrating the periphery of one memory cell of the semiconductor memory device according to the present invention.
Figure 11B:
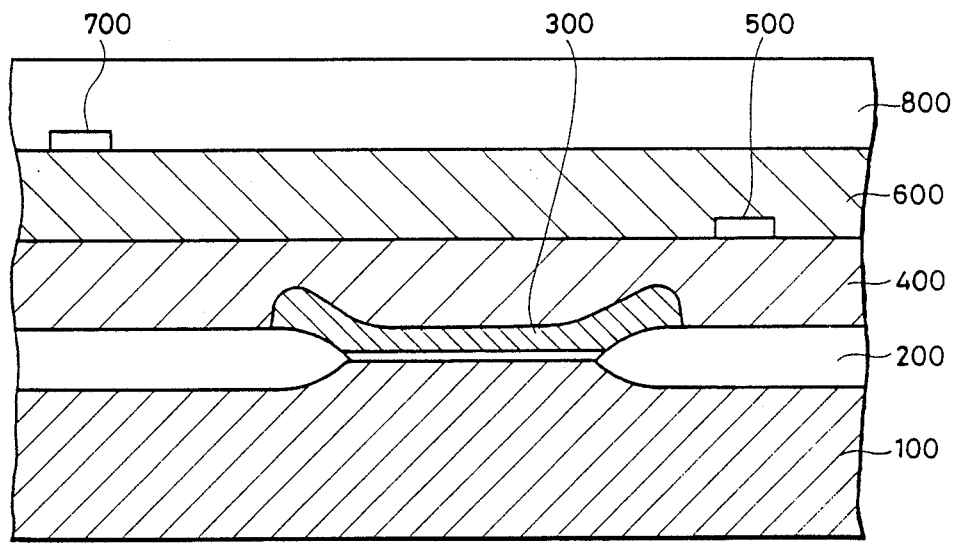
FIG. 11B is a cross sectional view of the semiconductor memory device shown in FIG. 11A.

FIG. 11A is a diagram illustrating one of the memory cells of the semiconductor memory device and its periphery according to the present invention; and FIG. 11B is a cross sectional view taken along the broken line B—B in FIG. 11A. The memory cell shown in FIG. 11A differs from the conventional one shown in FIG. 3A in the following respects. That is, the main row-selecting line $66_1$ and the sub row-selecting line $67_{11}$ according to the present invention are formed.

As shown in FIG. 11B, reference numerals 100, 200, 300, 400, 500, 600, 700 and 800 designate, respectively, a semiconductor substrate, an isolation film formed of $SiO_2$, a polysilicon layer corresponding to the word line $68_{11}$, a first interlayer insulating film formed of $SiO_2$, a first layer aluminum interconnection formed thereon corresponding to the sub row-selecting line $67_{11}$, a second interlayer insulating film formed of $SiO_2$, a second layer aluminum interconnection formed thereon corresponding to the main row-selecting line $66_1$, and a passivation film.

In all the embodiments of the present invention, an arrangement of the main row-selecting line, the sub row-selecting line and the divided word line is not limited to the one shown in FIG. 11B, and such combinations are possible for materials of these lines as follows.

(1) The main row-selecting line can be formed of one of a polysilicon layer, a first metal interconnection layer and a second metal interconnection layer.

(2) The sub row-selecting line can be formed of one of the polysilicon layer, the first metal interconnection layer and the second metal interconnection layer.

(3) The divided word line can be formed of one of the polysilicon layer, the first metal interconnection layer and the second metal interconnection layer.

The above described polysilicon layer can be shared with a polysilicon layer constituting the gate of the access transistor of the memory cell, thereby implementing the large capacity semiconductor memory device without an area of the memory cell increased.

The formation of the described main row-selecting line and sub row-selecting line as the same layer simplifies the manufacturing process of the device and thus further reduces the manufacturing cost thereof. Particularly, in the case0 of the fifth embodiment, and in the case of the combination of the fifth embodiment and the second, third or fourth embodiment, the number of the main row-selecting lines and sub row-selecting lines decrease, so that a spacing of interconnections becomes larger. Accordingly, it becomes possible to manufacture the semiconductor memory device at a lower cost without the chip area increased.

Furthermore, if the described main row selecting lines and sub row-selecting lines are formed as different layers from each other, the chip area does not increase depending on a spacing of the main row selecting lines and that of the sub row-selecting lines, thereby achieving a higher degree of integration of the semiconductor memory device.

As a matter of course, the semiconductor memory device with a much enhanced speed operability can be implemented if the described polysilicon layer is made polycide with such materials as molybdenum and tungsten.

In addition, in all the embodiments of the present invention, the main global decoders, the sub global decoders and the local decoders are all denoted with a symbol of AND gates; however, their inputs and outputs may be low active or high active, and these decoders are AND function gates in a broader sense, as a matter course.

Such an example was shown in all the embodiments of the present invention that the column selecting lines are divided into double-hierarchy of the main row-selecting lines and sub-row selecting lines; however, it is more preferable, of course, that larger capacity semiconductor memory devices have multi-hierarchical configurations such as triple-hierarchy or quadruple hierarchy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory cell array formed of a plurality of memory cells arranged in matrix; wherein said memory cell array is divided in the direction of columns into a plurality of large groups of memory cells, and each of said plurality of large memory cell groups is further divided in the direction of columns into a plurality of small groups of memory cells, said semiconductor memory device further comprising:
a plurality of first row-selecting lines provided in said memory cell array;
a plurality of second row-selecting lines provided in each of said plurality of large memory cell groups;
a plurality of word lines provided in each of said plurality of small memory cell groups and connected to said memory cells;
means for supplying a first selecting signal for selecting one of said plurality of large memory cell groups;
means for supplying a second selecting signal for selecting one of said plurality of small memory cell groups;
first decoder means responsive to an internal address signal for selecting one of said first-row-selecting lines to activate the same;
plurality of second decoder means provided in each said large memory cell group for selecting a second row-selecting line associated with said selected first row-selecting line to activate the same in the large memory cell group selected by said first selecting signal; and plurality of third decoder means provided in each said small memory cell group for selecting a word line associated with said selected second row-selecting line to activate the same in the small memory cell group selected by said second selecting signal.

2. A semiconductor memory device in accordance with claim 1, wherein
said first decoder means is provided near the end portion of said memory cell array, which is close to a supply source of said internal address signal.

3. A semiconductor memory device in accordance with claim 2, wherein
said second decoder means are each provided at the center of a corresponding one of said large memory cell groups.

4. A semiconductor memory device in accordance with claim 3, wherein
said second row-selecting lines separated horizontally by said second decoder means are driven independently by said second decoder means.

5. A semiconductor memory device in accordance with claim 3, wherein
said third decoder means are each provided at the center of a corresponding one of said small memory cell groups.

6. A semiconductor memory device in accordance with claim 5, wherein
said word lines separated horizontally by said third decoder means are driven independently by said third decoded means.

7. A semiconductor memory device in accordance with claim 2, wherein
said third decoder means are each provided at the center of a corresponding one of said small memory cell groups.

8. A semiconductor memory device in accordance with claim 7, wherein
said word lines separated horizontally by said third decoder means are driven independently by said third decoder means.

9. A semiconductor memory device in accordance with claim 1, wherein
said first decoder means is provided at the center of said memory cell array.

10. A semiconductor memory device in accordance with claim 9, wherein
said first row-selecting lines separated horizontally by said first decoder means are driven independently by said first decoder means.

11. A semiconductor memory device in accordance with claim 9, wherein
said third decoder means are each provided at the center of a corresponding one of said small memory cell groups.

12. A semiconductor memory device in accordance with claim 11, wherein
said word lines separated horizontally by said third decoder means are driven independently by said third decoder means.

13. A semiconductor memory device in accordance with claim 9, wherein
said second decoder means are each provided at the center of a corresponding one of said large memory cell groups.

14. A semiconductor memory device in accordance with claim 13, wherein
said second row-selecting lines separated horizontally by said second decoder means are driven independently by said second decoder means.

15. A semiconductor memory device in accordance with claim 13, wherein
said third decoder means are each provided at the center of a corresponding one of said small memory cell groups.

16. A semiconductor memory device in accordance with claim 15, wherein
said word lines separated horizontally by said third decoder means are driven independently by said third decoder means.

17. A semiconductor memory device in accordance with claim 1, wherein
said first row-selecting lines are each formed of one of a polysilicon or silicide layer, a first metal interconnection layer and a second metal interconnection layer;
said second row-selecting lines are each formed of one of the polysilicon or silicide layer, the first metal interconnection layer and the second metal interconnection layer; and
said word lines are each formed of one of the polysilicon or silicide layer, the first metal interconnection layer and the second metal interconnection layer.

18. A semiconductor memory device in accordance with claim 17, wherein
said first and second row-selecting lines are formed as the same layer.

19. A semiconductor memory device in accordance with claim 17, wherein
said first and second row-selecting lines are formed as different layers.

20. A semiconductor memory device in accordance with claim 1, wherein
said first, second and third decoder means are each constituted by a gate having an AND function.

21. A semiconductor memory device in accordance with claim 17, wherein
said first and second row-selecting lines are each formed by an aluminum layer.

22. A semiconductor memory device in accordance with claim 17, wherein
each of said plurality of memory cells includes an access transistor having its gate connected to a corresponding one of said word lines, and
said gate and said corresponding word line are formed as the same layer of polysilicon or silicide.

23. A semiconductor memory device in accordance with claim 17, wherein
resistance values of said first and second row-selecting lines are each lower than that of the word line.

24. A semiconductor memory device in accordance with claim 1, wherein
said second decoder means are each provided near the end portion of a corresponding one of said large memory cell groups, which is close to said first selecting signal supplying means.

25. A semiconductor memory device in accordance with claim 1, wherein
said third decoder means are each provided near the end portion of a corresponding one of said small memory cell groups, which is close to said second selecting signal supplying means.

26. A semiconductor memory device in accordance with claim 1, wherein said first and second row-selecting lines and said word lines are provided in parallel with each other.

27. A semiconductor memory device in accordance with claim 1, wherein
each of said word lines is shorter than said first row-selecting line.

28. A semiconductor memory device in accordance with claim 1, wherein
each of said word lines is shorter than said second row-selecting line.

29. A semiconductor memory device in accordance with claim 1, wherein
each of said second row-selecting lines is shorter than said first row-selecting line.

30. A semiconductor memory device in accordance with claim 1, wherein
said semiconductor memory device is a static random access memory.

31. A semiconductor memory device comprising:
a memory cell array formed of a plurality of memory cells arranged in matrix; wherein said memory cell array is divided in the direction of rows into a plurality of large row groups of memory cells; each of said plurality of large memory cell row groups is further divided in the direction of columns into a plurality of large groups of memory cells; each of said plurality of large memory cell groups is further divided in the direction of rows into a plurality of small row groups of memory cells; and each of said plurality of small memory cell row groups is divided in the direction of columns into a plurality of small groups of memory cells, said semiconductor memory device further comprising:
a plurality of first row-selecting lines each provided in each said large memory cell row group;
a plurality of second row-selecting lines each provided in each said small memory cell row group;
a plurality of word lines provided in each of said small memory cell groups and connected to said memory cells;
means for supplying a first selecting signal for selecting said plurality of large memory cell groups arranged in the same column and one of the small memory cell row groups in each of said large memory cell groups;
means for supplying a second selecting signal for selecting said plurality of small memory cell groups arranged in the same column and a row in each of said small memory cell groups;
first decoder means responsive to an internal address signal for selecting one of said first row-selecting lines to activate the same;
plurality of second decoder means provided in each said large memory cell group for selecting one of said plurality of second row-selecting lines, which corresponds to the small memory cell row group selected by said first selecting signal to activate the same, in one of the plurality of large memory cell groups selected by said first selecting signal, which is included in the large memory cell row group corresponding to said selected first row-selecting line; and
a plurality of third decoder means provided in each said small memory cell group for selecting one of said plurality of word lines, which corresponds to the row selected by said second selecting signal and activating the same, in one of the plurality of small memory cell groups selected by said second selecting signal, which is included in the small memory cell row group corresponding to said selected second row-selecting line.

32. A semiconductor memory device in accordance with claim 31, wherein
said first decoder means is provided near the end portion of said memory cell array, which is close to a supply source of said internal address signal.

33. A semiconductor memory device in accordance with claim 32, wherein
said third decoder means are each provided at the center of a corresponding one of said small memory cell groups.

34. A semiconductor memory device in accordance with claim 33, wherein
said word lines separated horizontally by said third decoder means are driven independently by said third decoder means.

35. A semiconductor memory device in accordance with claim 32, wherein
said second decoder means are each provided at the center of a corresponding one of said large memory cell groups.

36. A semiconductor memory device in accordance with claim 35, wherein
said second row-selecting lines separated horizontally by said second decoder means are driven independently by said second decoder means.

37. A semiconductor memory device in accordance with claim 35, wherein
said third decoder means are each provided at the center of a corresponding one of said small memory cell groups.

38. A semiconductor memory device in accordance with claim 37, wherein
said word lines separated horizontally by said third decoder means are driven independently by said third decoder means.

39. A semiconductor memory device in accordance with claim 31, wherein
said first decoder means is provided at the center of said memory cell array.

40. A semiconductor memory device in accordance with claim 39, wherein
said first row selecting lines separated horizontally by said first decoder means are driven independently by said first decoder means.

41. A semiconductor memory device in accordance with claim 39, wherein
said third decoder means are each provided at the center of a corresponding one of said small memory cell groups.

42. A semiconductor memory device in accordance with claim 41, wherein
said word lines separated horizontally by said third decoder means are driven independently by said third decoder means.

43. A semiconductor memory device in accordance with claim 39, wherein
said second decoder means are each provided at the center of a corresponding one of said large memory cell groups.

44. A semiconductor memory device in accordance with claim 43, wherein
said second row-selecting lines separated horizontally by said second decoder means are driven independently by said second decoder means.

45. A semiconductor memory device in accordance with claim 43, wherein
said third decoder means are each provided at the center of a corresponding one of said small memory cell groups.

46. A semiconductor memory device in accordance with claim 45, wherein
said word lines separated horizontally by said third decoder means are driven independently by said third decoder means.

47. A semiconductor memory device in accordance with claim 31, wherein
said first row-selecting lines are each formed of one of a polysilicon or silicide layer, a first metal interconnection layer and a second metal interconnection layer;
said second row-selecting lines are each formed of one of the polysilicon or silicide layer, the first metal interconnection layer and the second metal interconnection layer; and
said word lines are each formed of one of the polysilicon or silicide layer, the first metal interconnection layer and the second metal interconnection layer.

48. A semiconductor memory device in accordance with claim 47, wherein
said first and second row-selecting lines are formed as the same layer.

49. A semiconductor memory device in accordance with claim 47, wherein
said first and second row-selecting lines are formed as different layers.

50. A semiconductor memory device in accordance with claim 31, wherein
said first, second and third decoder means are each constituted by a gate having an AND function.

51. A semiconductor memory device in accordance with claim 47, wherein
said first and second row-selecting lines are each formed of an aluminum layer.

52. A semiconductor memory device in accordance with claim 47, wherein
each of said plurality of memory cells includes an access transistor having its gate connected to a corresponding one of said word lines, and
said gate and said corresponding word line are formed as the same layer of polysilicon or silicide.

53. A semiconductor memory device in accordance with claim 47, wherein
resistance values of said first and second row-selecting lines are each lower than that of the word line.

54. A semiconductor memory device in accordance with claim 31, wherein
said second decoder means are each provided near the end portion of a corresponding one of said memory cell groups, which is close to said first selecting signal supplying means.

55. A semiconductor memory device in accordance with claim 31, wherein
said third decoder means are each provided near the end portion of a corresponding one of said small memory cell groups, which is close to said second selecting signal supplying means.

56. A semiconductor memory device in accordance with claim 31, wherein
said first and second row-selecting lines and said word lines are provided in parallel with each other.

57. A semiconductor memory device in accordance with claim 31, wherein
each of said word lines is shorter than said first row-selecting line.

58. A semiconductor memory device in accordance with claim 31, wherein
each of said word lines is shorter than said second row-selecting line.

59. A semiconductor memory device in accordance with claim 31, wherein
each of said second row-selecting lines is shorter than said first row-selecting line.

60. A semiconductor memory device in accordance with claim 31, wherein
said semiconductor memory device is a static random access memory.

* * * * *